United States Patent [19]

Grenier et al.

[11] 4,255,674
[45] Mar. 10, 1981

[54] SEMICONDUCTOR DEVICE HAVING A MULTIPLE-EMITTER TRANSISTOR

[75] Inventors: Didier J. R. Grenier; Jean M. H. Seguin, both of Caen, France

[73] Assignee: U.S. Philips Corporation, New York, N.Y.

[21] Appl. No.: 415

[22] Filed: Jan. 2, 1979

[30] Foreign Application Priority Data

Dec. 30, 1977 [FR] France ................. 77 39795

[51] Int. Cl.³ ............... H01L 27/10; G11C 11/40
[52] U.S. Cl. ................... 365/155; 357/36; 357/50; 357/51; 365/155
[58] Field of Search .............. 357/50, 51, 49, 36; 307/238; 365/155, 179

[56] References Cited

U.S. PATENT DOCUMENTS

| | | | |
|---|---|---|---|
| 3,648,125 | 3/1972 | Peltzer | 357/50 |
| 3,936,813 | 2/1976 | Tsang | 357/51 |
| 3,979,612 | 9/1976 | Mudge et al. | 357/50 |
| 4,011,580 | 3/1977 | Kasperkovitz | 357/51 |
| 4,035,784 | 7/1977 | Brown | 357/51 |
| 4,118,728 | 10/1978 | Berry | 357/50 |
| 4,149,177 | 4/1979 | Alter | 357/50 |

OTHER PUBLICATIONS

Wiedmann, IBM Tech. Disclosure Bulletin, vol. 13, No. 5, Oct. 1970, p. 1316.
Wiedmann, IBM Tech. Disclosure Bulletin, vol. 13, No. 3, Aug. 1970, pp. 616–617.

*Primary Examiner*—William D. Larkins
*Attorney, Agent, or Firm*—Thomas A. Briody; Robert T. Mayer; Steven R. Biren

[57] ABSTRACT

A semiconductor device includes a bipolar transistor having at least two emitter zones. One of the emitter zones is divided into two separate sub-zones, which are separated by a conductive channel which connects the base zone to an adjoining resistive zone. Two substantially identical transistors of the type disclosed may be interconnected in a cross-coupled arrangement to form an ECL memory cell.

9 Claims, 6 Drawing Figures

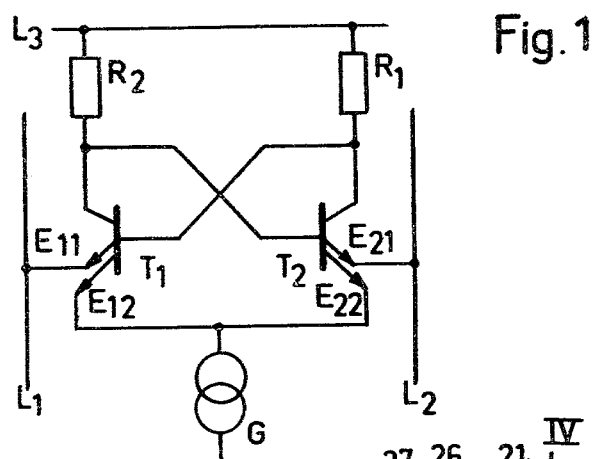
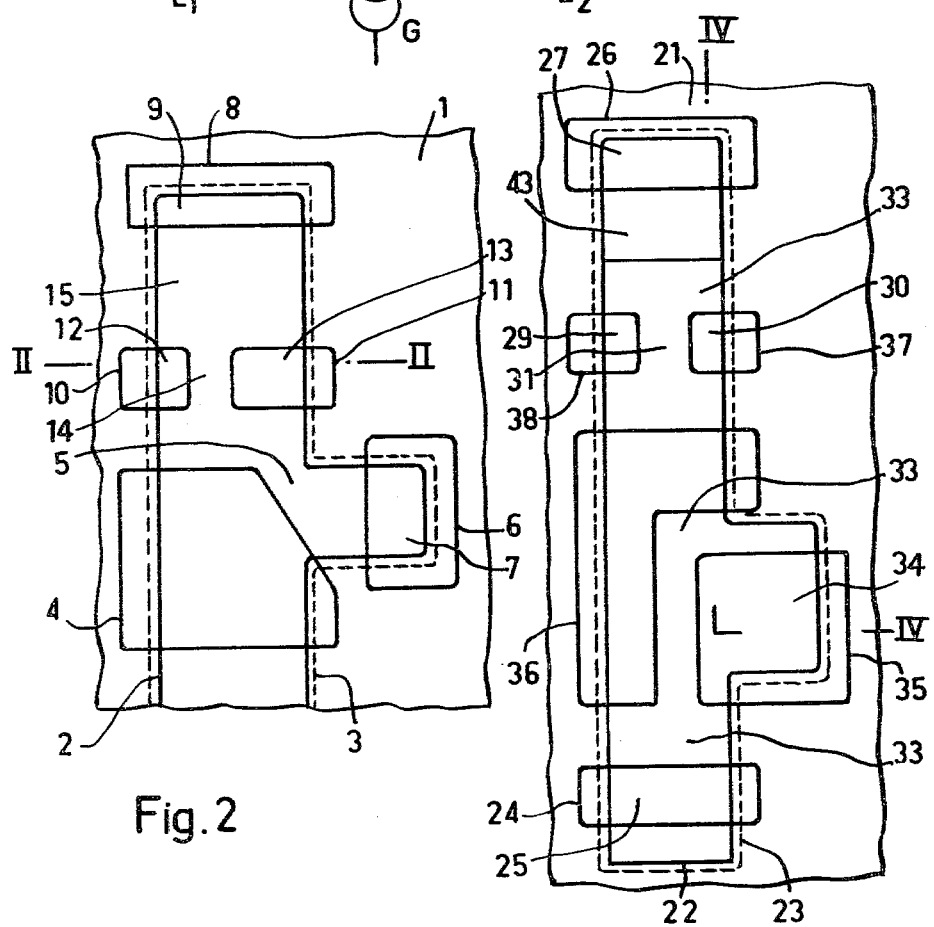

SEMICONDUCTOR DEVICE HAVING A MULTIPLE-EMITTER TRANSISTOR

The invention relates to a semiconductor device having a semiconductor body comprising a surface-adjoining island-shaped region in which a transistor is provided having a collector region of a first conductivity type, a base region of the second conductivity type and at least two emitter regions of the first conductivity type in which, viewed on the surface, the base is situated above the collector region and the emitter regions are situated above the base region and the base region is connected to a resistor formed by a resistive zone of the second conductivity type which is provided in the island-shaped region, adjoins the base region and has two connections of which a first also constitutes a base contact.

The combination of a transistor and resistor in the base track of the transistor is of particular importance for memory circuit sof the ECL (emitter coupled logic) type. These circuits comprise, per memory cell, two transistors having cross-coupled base and collector regions. The collector-regions are connected, via the resistors serving as load elements, to a first supply line, an emitter region of each transistor is connected to a second supply line, and the other emitter regions are connected to read/write lines. Such a memory circuit in which the load resistor is constructed as an extension of the base zone of the other transistor, is disclosed inter alia in U.S. Pat. No. 4,035,784. The emitter regions in this known device are situated on either side of the base contact and on either side of a line which may be drawn between the base contact and the second connection of the resistive zone. The part of each of the island-shaped regions comprising the emitter regions and the base contact region which forms the actual transistor region is wider than the remainder of the island-shaped region comprising the resistive zone.

Memory cells of the type described are usually combined in very large numbers in a common semiconductor body to form a memory matrix. In order to be able to provide a maximum number of cells per volume unit volume of semiconductor material it is, of course, of importance to make cells (or half cells) as small as possible. Moreover, the compactness of the memory matrix can be considerably improved by giving the cells, or rather the island-shaped regions, a favorable configuraion which is as regular as possible so that the nonused space in the semiconductor body between adjacent island-shaped regions is minimized.

One of the objects of the invention is to provide a semiconductor device of the type described above having a compact and comparatively regular configuration and which is particularly suitable as a unit cell in an integrated semiconductor memory.

The invention is inter alia based on the recognition of the fact that a considerable saving in area can be obtained by not providing the emitter regions on either side of the center line between the base contact and the said second connection of the resistive zone, but along said line behind each other on either side of the base contact.

According to the invetion, a semiconductor device of the above-mentioned kind is characterized in that the side walls of the island-shaped region are bounded by a dielectric and that a first emitter region is situated between the base contact and the second connection of the resistive zone and the second emitter region is situated beside the opposite side of the base contact remote from the second connection, and that the base region and/or the resistive zone, at least at the area of the first emitter region, and the first emitter region extend transversely over the width of the island-shaped region and adjoin the dielectric, and the first emitter region has an opening which forms a channel for the current between the base contact and the second connection of the resistive zone and divides the first emitter region into at least two separate sub-regions each adjoining the dielectric only on one side.

In fact, the said first emitter region thus is provided in the resistive zone and consequently occupies little or no extra space so that a considerable reduction in size of the island-shaped region can be obtained as compared with known devices. Since in addition the two emitter regions, viewed from the said second connection of the resistive zone, are provided behind each other—on either side of the base connection—instead of beside each other, the island-shaped region can be given a shape which is particularly suitable for the manufacture of an integrated semiconductor memory having a large number of memory cells.

Due to the small dimensions and the associated small stray capacitance, the speed at which the device can be operated may be high.

Since furthermore both the resistive zone and the two said sub-regions of the first—the divided—emitter region adjoin the dielectric at the area of the first emitter region, the resistance value of the resistive zone at the area of the first emitter region is determined only or at least mainly by the width of the channel between the two emitter regions. Since said width is independent of tolerances in the mutual positioning of the two sub-regions, the resistive zone, and the dielectric, the accuracy of the resistance is influenced only slightly or not at all by the presence of the first emitter region in the resistive zone.

In this connection it is to be noted in addition that transistors in which the base and the emitter or emitters extend transversely over the whole width of the base and are both bounded laterally by a dielectric, for example oxide, are known per se. However, such an emitter configuration is less favorable for a semiconductor device of the type to which the present invention relates because in this case the current would have to flow below the emitter. Because in most constructions the doping concentration of the resistive zone decreases strongly from the surface downwards and hence the resistivity in the same direction increases considerably, the overall resistance value would become higher when this emitter configuration is used than would be desired for favorable operation of the device. Moreover, the accuracy of such so-called "pinch" resistors generally is very poor. In the semiconductor device embodying the invention, however, these disadvantages are avoided as already described by providing the said first emitter region with an opening which forms a channel for the current through the resistor so that at the area of said emitter region the resistive zone behaves as a usual resistive zone mainly operative at the surface and not as a pinch resistor described above.

Furthermore it is to be noted that the emitter surface in an emitter configuration embodying the invention advantageously is also independent of alignment tolerances which should be observed in the mutual positioning of the emitter regions, the resistive zone and the dielectric.

The known advantage of dielectric island insulation over the usual p-n insulation, namely the more compact structures which can be obtained since, for example, the base zone and resistive zone may directly adjoin the island insulation in contrast with the usual p-n insulation, are also obtained in devices according to the present invention.

The said first emitter region may be divided into two or more sub-regions in which only the two outermost adjoin the dielectric. A preferred embodiment is characterized in that the said first emitter region is divided into two sub-regions. In this embodiment, as will become apparent from the description of the figures, the contact windows and the contacts above the subregions may be provided so as to partly overlap the dielectric, which presents great advantages in particular when the sub-regions are small.

The dielectric may be formed, for example, by a groove the side walls of which may be covered, if desired, with an insulating material, or by a groove which is filled entirely or partly with insulating material, for example silicon nitride or aluminium oxide. A preferred embodiment is characterized in that the said dielectric is formed by a pattern of silicon oxide which is sunk in the semiconductor body at least over a part of its thickness. The silicon oxide pattern may be obtained in a known and simple manner by locally oxidizing the semiconductor body, adjoining parts of the semiconductor surface being masked against oxidation by a silicon nitride layer.

The invention is not exclusively but particularly important for semiconductor memories of the above-described ECL type. A semiconductor device according to this aspect of the invention is characterized in that the transistor and the resistive zone, hereinafter termed first transistor and first resistive zone, respectively, form part of a memory cell further comprising a second transistor and resistive zone substantially identical to the first transistor and resistive zone, respectively, provided in a second island-shaped region of the semiconductor body beside the first-mentioned island-shaped region, the base and collector regions of the first and second transistor being connected together crosswise, the said other connection of the resistive zones being connected to a first supply line, one of the emitter regions of each transistor being connected to a second supply line and the other emitter regions being connected to read/write lines.

Embodiments of the invention will now be described in greater detail with reference to the diagrammatic drawings, in which:

FIG. 1 is a circuit diagram of a known ECL memory cell;

FIG. 2 is a plan view of a part of an integrated circuit embodying the invention having a transistor and a resistor;

FIG. 4 is a plan view of part of a second integrated circuit in accordance with the invention;

Figure 3:
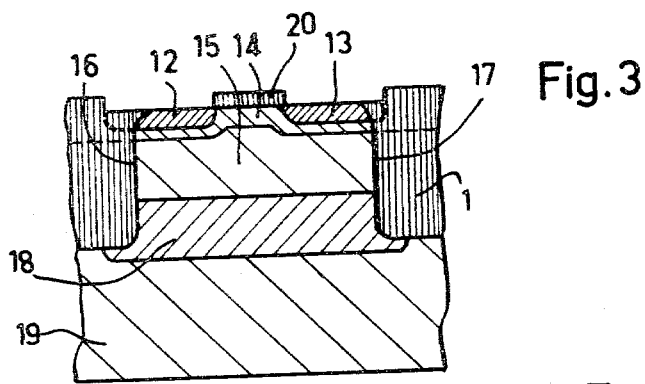
FIG. 3 is a cross-sectional view of the device taken on the line II—II of FIG. 2.

The semiconductor device shown in FIGS. 2 and 3 comprises a semiconductor body having a substrate 19 of a first conductivity type which is covered by an epitaxial layer 15 of the same conductivity type. The layer 15 is slightly doped and has a high sheet resistance, for example in the order of $7000\Omega/\square$. The conductivity of the surface layer 14 of the layer 15 is increased, for example, by diffusion or by ion implantation of a dopant which provides the first conductivity type. The layer 15 and the layer 14 constitute the base region 5 of a transistor. Along its circumference 2, 3, said transistor is bounded by the dielectric oxide pattern 1 and in the bulk by a buried layer 18 which has an opposite conductivity type, is strongly doped and constitutes the collector of the transistor.

The solid line 2 corresponds to the visible circumference at the surface, while the broken line 3 corresponds to the circumference of the pattern 1 in the bulk, the difference being caused by the known so-called "bird beak phenomenon."

The circumference 2, 3 of the insulation pattern 1 in cooperation with the buried layer 18 defines an island-shaped part within the epitaxial layer 15. This island has a zone 7 which is higly doped with the said opposite conductivity type. The zone 7 extends from the surface of the plate down to the buried layer 8 and constitutes a collector contact zone.

The island-shaped region comprises a part which is used as a resistor and forms a continuation of the base of the transistor. At its end part it has a zone 9 which is very highly doped with the conductivity type of the base. The zone 9 constitutes a contact zone of a second connection of the resistor which is formed by the part of the island between the zone 9 and the base contact 4. In the case in which the surface layer 14 is sufficiently doped, the zone 9 is not necessary.

The emitter of the transistor consists of two surface zones 12 and 13 the thickness of which is in the order of that of the layer 14 and is highly doped with the said opposite conductivity type. Between said two zones an opening is left which forms the decisive part of the resistor, the said continuation at the area of the emitter. The thickness of the layer 14 below the emitter may slightly differ from the thickness beside the emitter, as a result of pushing effects of the dopant of the emitter.

The contacts at the collector, the base, the emitter and the resistor are obtained by means of metal layers not shown in the drawings via windows in an oxide layer 20 which protects the surface of the device. The collector contact window is referenced 6, the base contact window is referenced 4, the emitter contact windows are referenced 10 and 11. According to a known method of manufacturing semiconductor devices having dielectric insulation, contact windows in the surface oxide layer may be determined by means of localization masks of the diffusions or implantation which may partly overlap the oxide pattern 1.

The resistor which is in series with the base of the transistor is provided by the parts of the layer 15 and in particular by parts of the layer 14 which are situated between the base contact or first resistance connection (bounded by the window 4) and the resistor contact or second connection (bounded by the window 8). Schematically, three series resistance parts may be distinguished, of which one is at the area of the emitters, and two other parts are on either side of the emitters. The decrease in the width of the low-resistivity layer at the area of the emitters gives said part a higher and hence predominant resistance. In this part may be distinguished a narrow surface part of the layer 14 of low resistivity which is parallel to a deeper part of higher resistivity, and the narrow surface part of the layer 14 of low resistivity mainly determines the value of the resistor.

It has been found that the windows 10 and 11 determining the emitter zones 12 and 13 can be obtained simultaneously with the same mask and that these may project over the insulating oxide pattern 1. The distance between the emitter zones 12 and 13 can thus be obtained accurately; moreover, the overall emitter area does not depend on an alignment error, if any, of the zones 12 and 13 with respect to the circumference of the insulating oxide pattern 1 bounding the zones 12 and 13.

Figure 5:
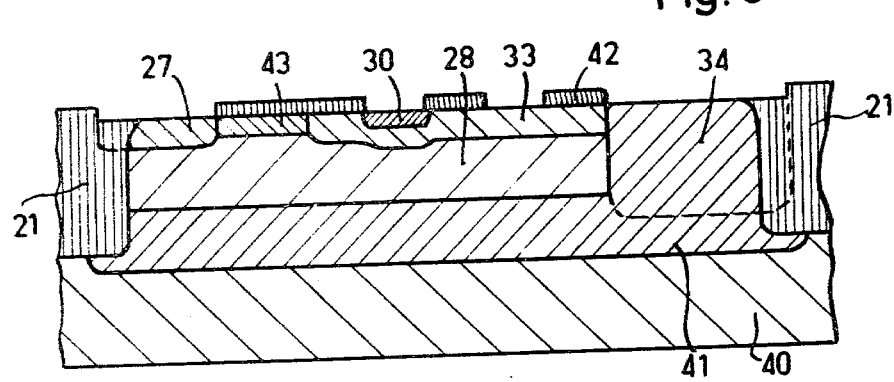
FIG. 5 is a diagrammatic sectional view taken on the line IV—IV of the circuit shown in FIG. 4.

The device to be described with reference to FIGS. 4 and 5 relates to an element of an integrated circuit in a semiconductor body having a substrate 40 of the p-type which is covered with an epitaxial layer 28 of the n-type. The element is bounded at the surface along the lines 22 and 23 by a silicon oxide pattern 21 which is sunk in the body (40, 28) and extends down to the substrate and determines an island-shaped part in the epitaxial layer. A buried zone 41 of the n-type (the sign-+denotes a high doping concentration higher than $10^{17}$ atoms per $cm^3$) which not necessarily but preferably extends below the whole island is provided between the substrate 40 and the layer 28. The zone 41 and the layer 28 constitute the collector of a transistor. The collector furthermore has a zone 34 of the N+-type which extends from the surface down to the zone 41 and is destined to make contact with the collector.

The base of the transistor comprises a layer 33 of the P-type which is situated at the surface and which has a sheet resistance in the order of $500\Omega/\square$.

The transistor has two emitters which are situated on either side of the base contact 36, an emitter 25 on one side and an emitter on the other side formed by two separate sub-regions 29 and 30; with respect to the base contact the latter are situated on the same side as the continuation of the layer 33. Said continuation comprises a layer portion 43 of a high street resistance and forms a series resistance in the base track of the transistor. The end of the resistor has a surface zone 27 of the P-type which is analogous to the layer 33 and which is destined to make a contact on said resistor, the other connection of which is formed by the base contact 36. The surface zones 25, 29, 30 are zones of the N+-type which are highly doped and have preferably been obtained by ion implantation via apertures 24, 38 and 37, respectively, provided in a masking layer of silicon nitride and silicon oxide and afterwards also serve as contact apertures. The two zones 29 and 30 leave a narrow portion 31 of the layer 33 free in a width which is determined by the mutual distance between the zones 29, 30 and which forms a part of the resistor between the base contact 36 and the contact 27. Between the layer 33 and the zone 27 the surface layer portion 43 forms a high value resistance part having a sheet resistance in the order of $6000\phi/\square$.

The contacts, not shown in the drawings, on the collectors, base and the emitter of the transistor and on the resistor may be made in the usual manner by means of metal layers in the windows in the oxide layer 42 which covers the surface of the semiconductor body. The collector contact window is denoted by 35, the base contact window by 36, the emitter contact windows by 24, 38 and 37 and the resistor contact window by 26.

Figure 6:
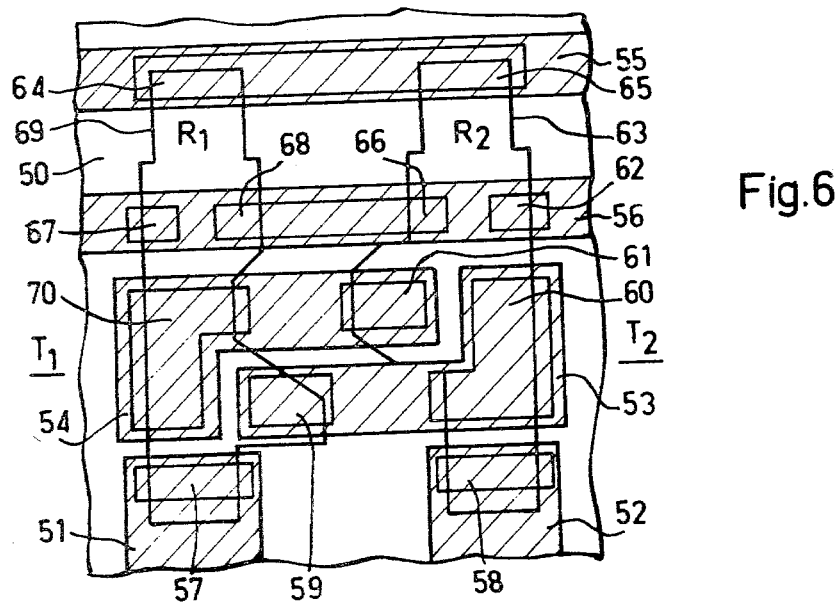
FIG. 6 is a plan view of an integrated memory cell in accordance with the invention.

The element described with reference to FIGS. 4 and 5 and if desired the element described with reference to FIGS. 2 and 3, if it comprises a second emitter, may form together with a second similar element a memory cell for a matrix of a static memory of the ECL type. FIG. 6 is a plan view of such a cell of which FIG. 1 shows the circuit diagram and which comprises two of the above-described elements.

The elements are bounded laterally by the oxide 50 along the lines 63 and 69. As in the preceding examples they are formed in an epitaxial layer deposited on a substrate and having a buried collector zone between the substrate and the epitaxial layer. In FIG. 6 metal connections are shown which for clarity are assumed to be transparent so as to be able to show the various contact regions. For the first element composed of transistor $T_1$ and resistor $R_1$, 59 is the contact region of the collector of $T_1$, 70 is the contact region of the base, 57 is that of a first emitter, 67 and 68 those of the two sub-regions of the divided emitter, 64 that of the resistor. The corresponding contact regions for the second element are 61, 60, 58, 66, 62 and 65, respectively.

A metal connection 55 connects the two resistors $R_1$ and $R_2$ to a so-called word line ($L_3$ in FIG. 1) which itself may be connected to a supply via a known address circuit. A metal connection 56 connects the divided emitters of the two emitters to a current source G (see FIG. 1). The collector of $T_1$ is connected to the base of $T_2$ by the metal connection 53 and hence to the resistor $R_2$. The collector of $T_2$ is connected to the base of $T_1$ by the metal connection 54 and hence to the resistor $R_1$. A metal connection 51 connects the other emitter of $T_1$ to a read and write line ($L_2$ in FIG. 1) and a metal connection 52 connects the other emitter of $T_2$ to the other write and read line of the same column of memory cells of the memory matrix (line $L_1$ in FIG. 1).

The method of manufacturing an integrated circuit according to the invention or of a memory cell according to the invention as described above presents no special difficulties and starts from known methods which are used in the manufacture of integrated circuits with dielectric insulation. For example, a silicon substrate of the P-type may be used in which zones are formed for the buried layers of the N+ type in which an epitaxial layer of the P or N type is deposited. By means of the conventional masking methods, a pattern of sunken oxide is then formed in the epitaxial layer which defines the island-shaped parts in the epitaxial layer.

By means of diffusion or implantation via a suitable mask n+ collector contact zones may then be formed. Another surface diffusion of impurities of the P type is carried out via the apertures of a mask which correspond to the bases of the transistors and to the ends of the resistors $R_1$, $R_2$. Said diffusion may advantageously be replaced by an ion implantation. In fact it is known that the ion implantation enables a better control of doping concentration and of the resulting sheet resistance adapted to the requirements of the ECL technique. For example, an implanted base layer of the P type has a small thickness in the order of only 0.25 to 0.45 μm, in an epitaxial layer of the P type which itself has a thickness of approximately 1 μm.

In a subsequent step contact windows for the collectors, the bases, the emitters and the resistors may be provided in the passivating layer which covers the surface of the body and, for example, may comprise a silicon nitride and a silicon oxide layer. The emitter contact windows also serve for the implantation of said emitters. The connections are then obtained by depositing a metal and photo-etching. The implantation of the emitters preferably is carried out prior to the implantation of the base surface layer. The implanted emitters have thicknesses of, for example, 0.2 to 0.3 µm.

The various mask apertures or windows may preferably project above the sunken oxide pattern, the oxide not losing its dielectric qualities during diffusion or implantation of impurities. This permits the manufacture of circuit elements of very small dimensions and a very high integration density. For example, the distance between the two sub-zones of an emitter may be 4µ and be reduced, if necessary to 2µ, the distance between the oppositely located insulating side walls being 10 µ m and the width of the emitter, taken perpendicularly to the preceding distance, being 4 µ m. On the other hand it is known that the photoetching methods permit obtaining tolerances of alignment of various masks which are smaller than 1 µ m and opening definitions in the order of 2 µ m. Taking into account the masking tolerances, it is preferable to give the two zones of an emitter identical dimensions and to place said zones symmetrically with respect to the oppositely located insulating walls of the sunken oxide pattern.

Methods of self-aligning the various masks by means of a principal mask and partial replicas thereof which are used successively for the various operations have already been suggested for further improvement in the accuracy of the geometry of the zones and of the apertures and to increase the integration density. These methods may be used for the manufacture of circuit elements according to the invention in the same manner as they are used for known integrated circuits having dielectric insulation and requiring high definition.

What is claimed is:

1. A semiconductor device having a semiconductor body comprising a surface-adjoining island-shaped region in which a transistor is provided having a collector region of a first conductivity type, a base region of a second conductivity type opposite to that of the first and at least two emitter regions of the first conductivity type in which, viewed on the surface, the base is situated above the collector region, the emitter regions are situated above the base region, and the base region is connected to a resistor formed by a resistive zone of the second conductivity type which is provided in the island-shaped region, adjoins the base region and has two connections, a first of which comprises a base contact, characterized in that the side walls of the island-shaped region are bounded by a dielectric and that a first emitter region is situated between the base contact and the second connection of the resistive zone and the second emitter region is situated on the side of the base contact remote from the second connection, that the base region, at least at the area of the first emitter region, and the first emitter region both extend transvrsely over the width of the island-shaped region and adjoin the dielectric, and that the first emitter region includes an aperture which contains a conductive channel portion of the base region for carrying the current between the base contact and the second connection of the resistive zone, which channel divides the first emitter region into at least two separate sub-regions, each adjoining the dielectric on only one side.

2. A semiconductor device as claimed in claim 1, characterized in that said first emitter region is divided into only two sub-regions.

3. A semiconductor device as claimed in claim 1 or 2, characterized in that the two sub-regions are substantially equally sized and positioned substantially symmetrically with respect to the center line between the two connections of the resistive zone.

4. A semiconductor device as claimed in claim 1, characterized in that the second emitter region and the base region at the area of the second emitter region also extend transversely over the width of the island-shaped region and adjoin the dielectric.

5. A semiconductor device as claimed in claim 4, characterized in that the second emitter region is formed by a coherent zone extending over the whole width of the island-shaped region.

6. A semiconductor device as claimed in claim 1, characterized in that said dielectric is formed by a pattern of silicon oxide which is sunk in the semiconductor body over at least a part of its thickness.

7. A semiconductor device as claimed in claim 1, characterized in that said transistor and said resistive zone, hereinafter termed first transistor and first resistive zone, respectively, form part of a memory cell which further comprises a second transistor and a second resistive zone substantially identical to the first transistor and resistive zone, respectively, provided in a second island-shaped region of the semiconductor body beside the first-mentioned island-shaped region, the base and collector regions of the first and second transistors being connected together in cross-coupled fashion, said second connections of the resistive zones being connected together and to a first supply line, a first of the emitter regions of each transistor being connected to a second supply line, and the second emitter regions thereof being connected to read/write lines.

8. A semiconductor device as claimed in claim 7, characterized in that the emitter regions divided into separate sub-regions are connected to the second supply line.

9. A semiconductor device having a semiconductor body comprising a surface-adjoining island-shaped region in which a transistor is formed having a collector region and an emitter region of the first conductivity type and an intermediate base region of a second conductivity type opposite to that of the first, in which, viewed on the surface, the emitter region is situated above the base region and the base region is situated above the collector region, and the base region and the emitter region each adjoin, on at least on two oppositely located sides, a pattern of insulating material which is sunk in the semiconductor body at least over a part of its thickness, characterized in that the emitter region, viewedalong its center line between the two said oppositely located sides, is divided into two separate sub-regions each adjoining the pattern of insulating material only on one side, said two separate sub-regions being provided with a common emitter contact.

* * * * *